United States Patent
Kim (10) Patent No.: US 7,306,993 B2
(45) Date of Patent: Dec. 11, 2007

(54) METHOD FOR FABRICATING SEMICONDUCTOR DEVICE WITH RECESSED CHANNEL

(75) Inventor: Tae Kyun Kim, Yongin-si (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 32 days.

(21) Appl. No.: 11/450,764

(22) Filed: Jun. 9, 2006

(65) Prior Publication Data
US 2007/0117364 A1    May 24, 2007

(30) Foreign Application Priority Data
Nov. 22, 2005    (KR) .................. 10-2005-0111548

(51) Int. Cl.
*H01L 21/336*    (2006.01)
(52) U.S. Cl. .............................. 438/282; 257/E21.655
(58) Field of Classification Search ............ 438/76, 438/146, 175, 270, 282, E21.655
See application file for complete search history.

(56) References Cited

U.S. PATENT DOCUMENTS

| | | | | |
|---|---|---|---|---|
| 5,668,394 | A | 9/1997 | Lur et al. ................. | 257/413 |
| 5,877,520 | A * | 3/1999 | Hynecek .................. | 257/223 |
| 2005/0042833 | A1* | 2/2005 | Park et al. ............... | 438/282 |
| 2005/0054163 | A1* | 3/2005 | Kim et al. ............... | 438/282 |
| 2007/0117294 | A1* | 5/2007 | Kim ........................ | 438/197 |

* cited by examiner

Primary Examiner—W. David Coleman
(74) Attorney, Agent, or Firm—Marshall, Gerstein & Borun LLP (57) ABSTRACT

A method for fabricating a semiconductor device with a recessed channel, including the steps of: forming trenches for a recessed channel in an active area of a semiconductor substrate; forming a gate insulating layer on the semiconductor substrate having the trenches; forming a gate conductive layer on the entire surface of the resulting structure so that the trenches are buried; forming a silicon-rich amorphous metal silicide layer having seams on the gate conductive layer; filling the seams of the silicon-rich amorphous metal silicide layer with a metal thin film; forming a gate hard mask on the silicon-rich amorphous metal silicide layer and the metal thin film; patterning the gate insulating layer, the gate conductive layer, the silicon-rich amorphous metal silicide layer and the gate hard mask to form gate stacks; and thermally processing the silicon-rich amorphous metal silicide layer and the metal thin film to form a crystallized metal silicide layer.

10 Claims, 8 Drawing Sheets

METHOD FOR FABRICATING SEMICONDUCTOR DEVICE WITH RECESSED CHANNEL

BACKGROUND OF THE INVENTION

1. Field of the Invention

The invention relates to a method for fabricating a semiconductor device and, more particularly, to a method for fabricating a semiconductor device with a recessed channel.

2. Description of the Related Art

With a drastic decrease in the design rule of integrated circuit semiconductor devices to a level of 70 nm or less, the gate resistance of cell transistors has been greatly increased and the channel length of cell transistors has been markedly decreased. Accordingly, planar transistor structures suffer from limitations in the realization of their gate resistance and threshold voltage. Under such circumstances, a great deal of research has been conducted on methods for ensuring a longer channel length without any increase in design rule. Particularly, studies are actively being undertaken on structures that have an extended channel length while maintaining a limited gate linewidth, for example, semiconductor devices having a recessed channel whose effective channel length is extended by recessing a semiconductor substrate and employing the recessed region as a gate structure.

FIGS. 1 to 8 are cross-sectional views illustrating a method for fabricating a conventional semiconductor device with a recessed channel.

Figure 1:
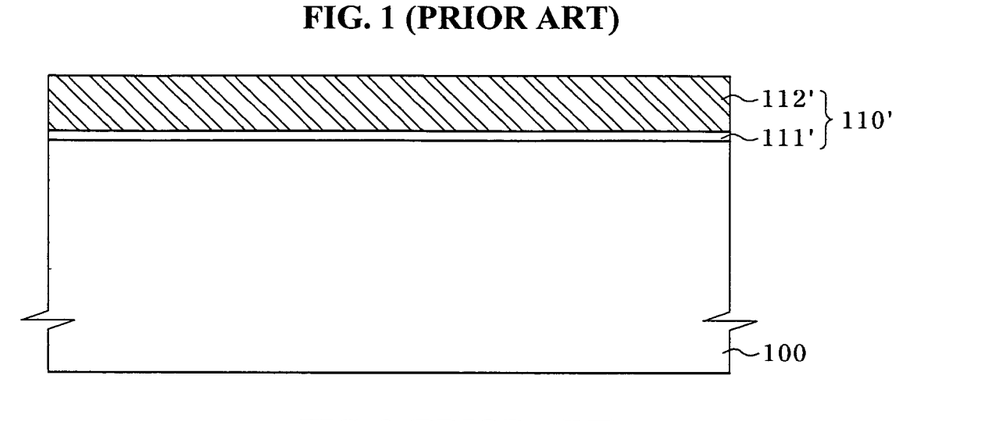
FIGS. 1 to 8 are cross-sectional views illustrating a method for fabricating a conventional semiconductor device with a recessed channel.
Figure 2:
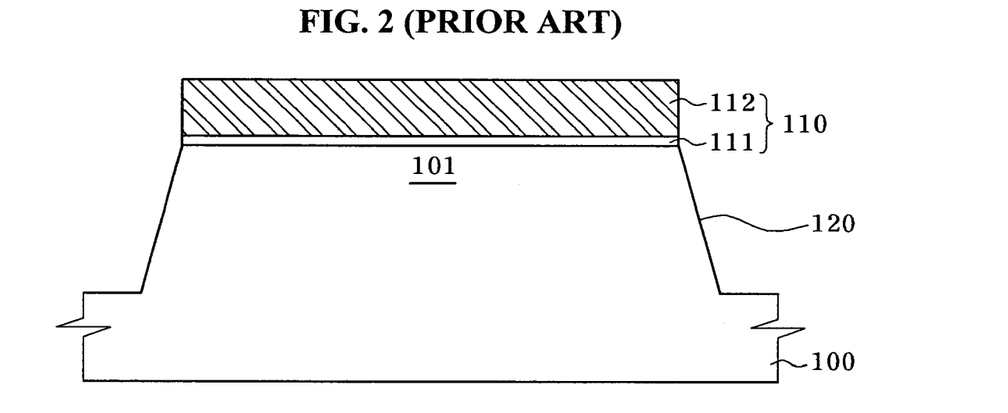

With reference first to FIG. 1, a pad oxide layer 111' and a pad nitride layer 112' are sequentially formed on a semiconductor substrate 100 to form a hard mask 110'. As shown in FIG. 2, portions of the surface of the semiconductor substrate 100, particularly isolation regions, are exposed by a common patterning process, leaving a hard mask pattern 110. The hard mask pattern 110 has a structure in which a pad oxide layer pattern 111 and a pad nitride layer pattern 112 are sequentially deposited. Subsequently, etching is conducted using the hard mask pattern 110 as a barrier layer to etch the exposed portions of the semiconductor substrate 100 to a predetermined depth to form trenches 120 for isolation defining an active area 101.

Figure 3:
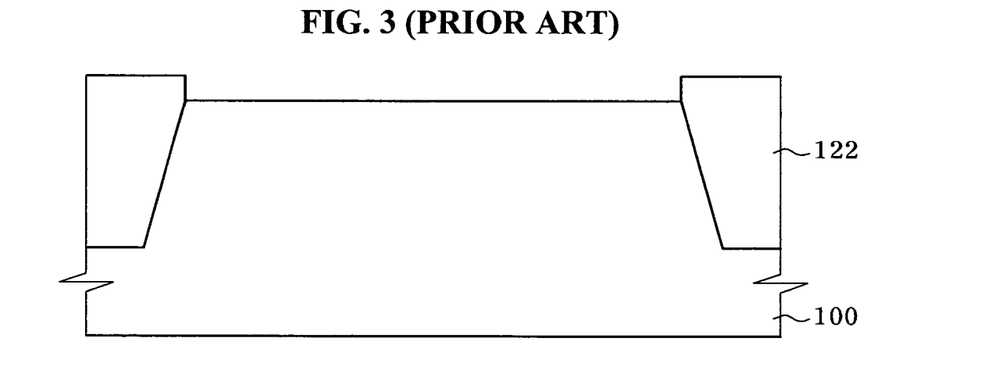
Figure 4:
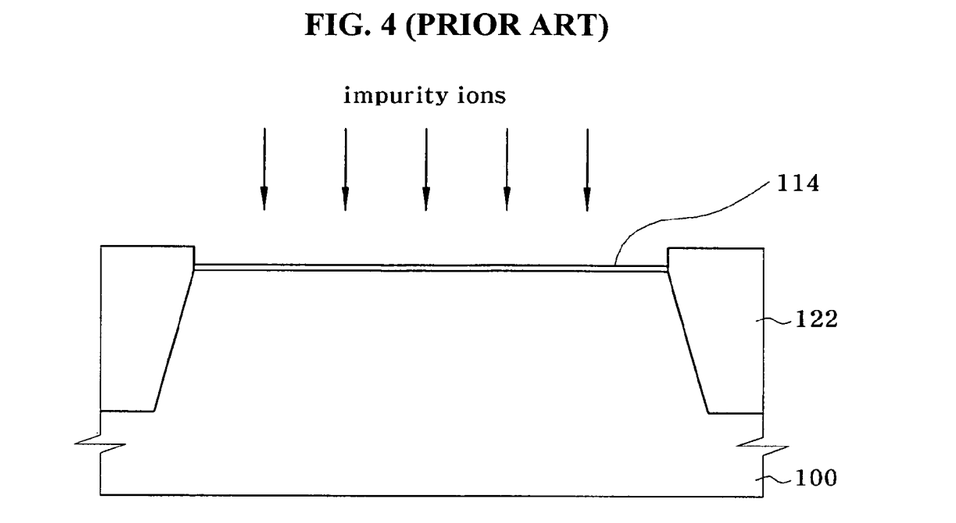
Figure 5:
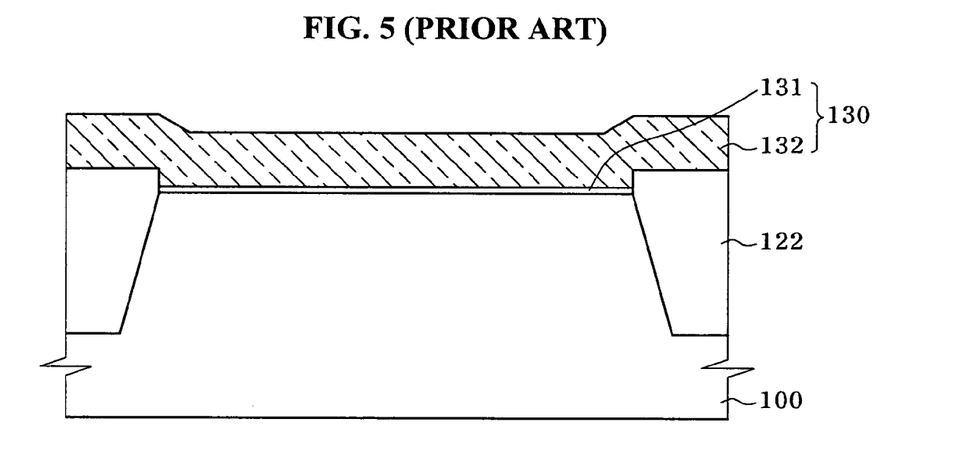
Figure 6:
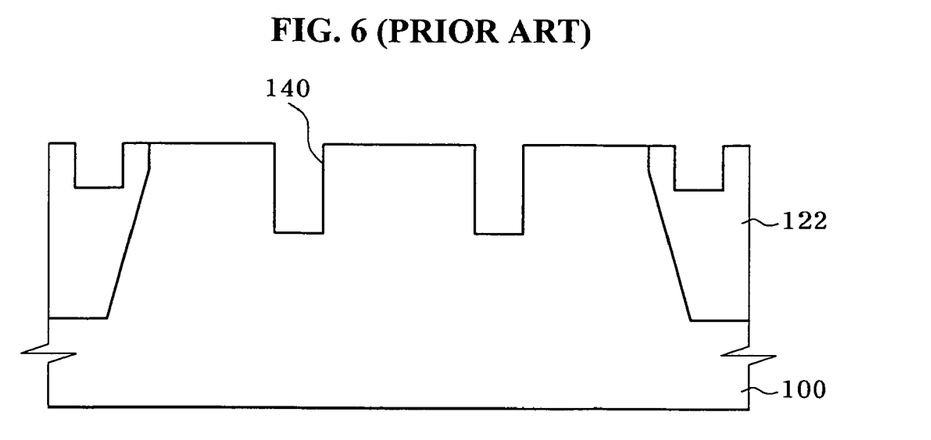

Next, as shown in FIG. 3, a buried insulating layer is deposited on the entire surface of the resulting structure, followed by planarization to form trench isolation layers 122. Then, the hard mask pattern (110 of FIG. 2) is removed. As shown in FIG. 4, a buffer oxide layer 114 is formed on the entire surface of the semiconductor substrate, followed by impurity ion implantation for control of threshold voltage and formation of well/channel. Thereafter, the buffer oxide layer 114 is removed. As shown in FIG. 5, a hard mask 130 including an oxide layer 131 and a polysilicon layer 132 is formed on the semiconductor substrate 100. As shown in FIG. 6, a line-shaped photoresist pattern (not shown) is used to form a hard mask pattern (not shown) through which a recessed region of the semiconductor substrate 100 is exposed. Subsequently, etching is conducted using the hard mask pattern as a barrier layer to etch portions of the semiconductor substrate 100 to a predetermined depth to form trenches 140 for a recessed channel. Then, the hard mask pattern is removed.

Figure 7:
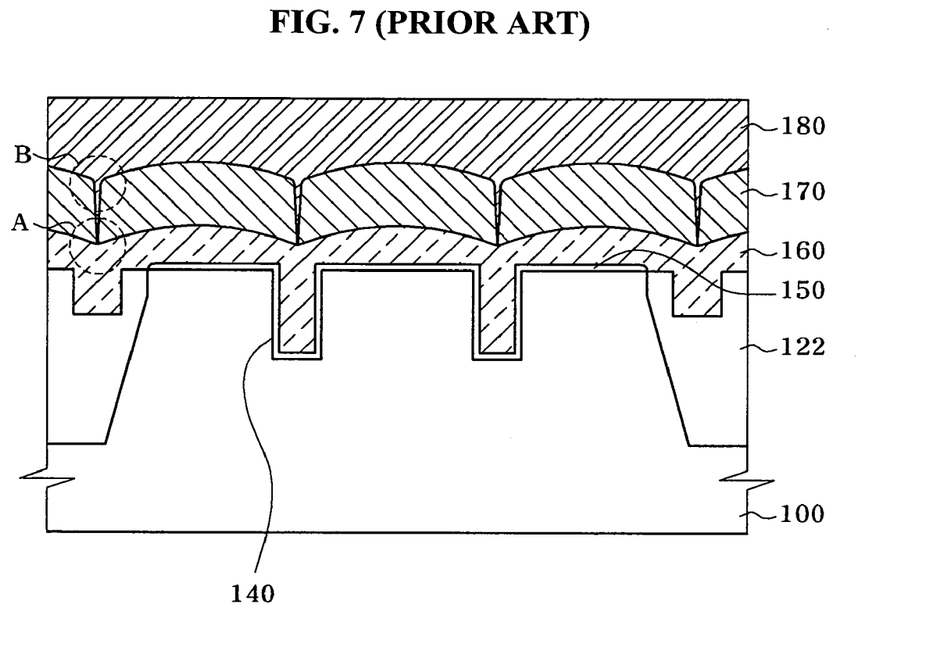
Figure 8:
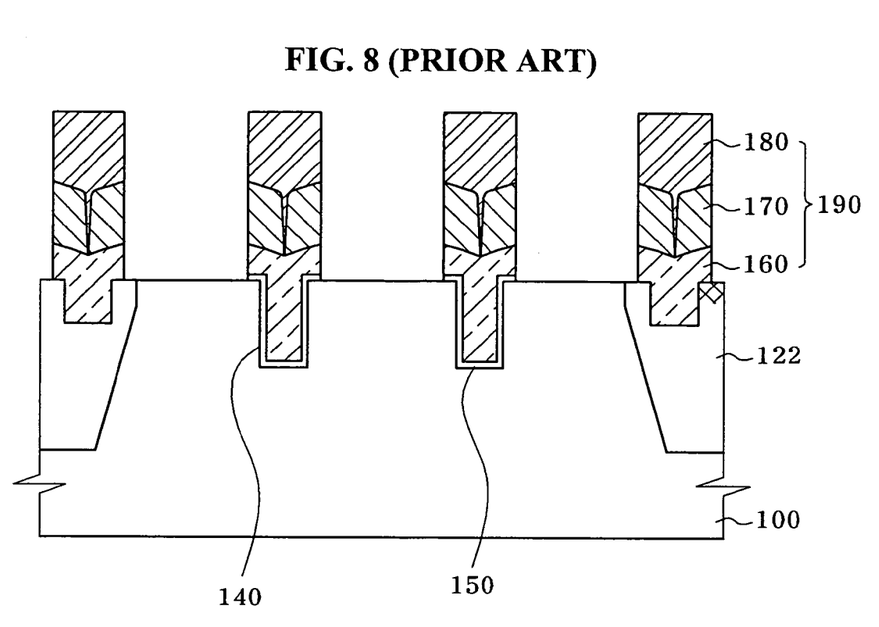

As shown in FIG. 7, a gate oxide layer 150 is formed on the entire surface of the semiconductor substrate, and then a polysilicon layer 160, a silicon-rich tungsten silicide layer 170 and a gate hard mask 180 are formed thereon in this order. As shown in FIG. 8, exposed portions of the gate hard mask 180, the silicon-rich tungsten silicide layer 170, the polysilicon layer 160 and the gate oxide layer 150 are removed in this order, leaving gate stacks 190.

The polysilicon layer 160 is grooved due to the presence of the trenches 140 for a recessed channel, as indicated by the sections "A" in FIG. 7. As a result, seams are formed due to poor step coverage of the tungsten silicide ($WSi_x$) layer formed during the subsequent step, as indicated by the sections "B" in FIG. 7, resulting in low reliability of the final device. As the tungsten silicide layer is crystallized during a subsequent thermal process, the seams may disappear but the volume of the tungsten silicide layer included under a predetermined gate linewidth is relatively diminished, which increases the resistance of word lines, and as a result, is a cause of reduced operating speed of the final device.

On the other hand, the deposition of the tungsten silicide layer 170 is achieved by chemical vapor deposition (CVD) using $WF_6$ and silane ($SiH_4$) as source gases. In the case where a tungsten-rich tungsten silicide layer is formed instead of the silicon-rich tungsten silicide layer, a reduction in word line resistance can be induced. Specifically, when the flow rate of $WF_6$ introduced into a chamber is increased, a tungsten (W)-rich tungsten silicide layer is formed. The finally crystallized tungsten silicide layer thus formed is relatively thicker than the initially deposited amorphous tungsten silicide layer. The reason for this difference in thickness is that excess tungsten (W) atoms present within the amorphous tungsten silicide layer react with polysilicon present within the underlying polysilicon layer during formation of the tungsten silicide layer by crystallization to form an additional tungsten silicide layer. Accordingly, an increase in the volume of the tungsten silicide layer included in the gate stacks can induce a reduction in word line resistance. However, the content of fluorine (F) components within the amorphous tungsten silicide layer is increased due to the use of the excess $WF_6$ gas, which increases the electrical thickness of the gate insulating layer and causes many problems, such as poor characteristics (e.g., gate oxide integrity (GOI)), making the method unsuitable for practical applications.

At present, since the silicon-rich tungsten silicide layer 170 is formed by relatively increasing the flow rate of silane during CVD to form an amorphous tungsten silicide layer, excess silicon atoms are used to form an additional silicon layer on the polysilicon layer 160, unlike in the formation of the tungsten-rich tungsten silicide layer. As a result, the finally crystallized tungsten silicide layer is relatively thinner than the initially deposited amorphous tungsten silicide layer, which causes an increase in the resistance of word lines.

SUMMARY OF THE INVENTION

Therefore, the invention has been made in view of the foregoing problems, and the invention provides a method for fabricating a semiconductor device with a recessed channel wherein a polysilicon layer is designed to have grooves and an increase in the resistance of word lines is inhibited despite an abundance of silicon components in a tungsten silicide layer.

In accordance with an aspect of the invention, there is provided a method for fabricating a semiconductor device with a recessed channel, the method including the steps of: forming trenches for a recessed channel in an active area of a semiconductor substrate; forming a gate insulating layer on the semiconductor substrate having the trenches; forming a gate conductive layer on the entire surface of the resulting structure so that the trenches are buried; forming a silicon-rich amorphous metal silicide layer having seams on the gate conductive layer; filling the seams of the silicon-rich amorphous metal silicide layer with a metal thin film; forming a gate hard mask on the silicon-rich amorphous metal silicide layer and the metal thin film; patterning the gate insulating layer, the gate conductive layer, the silicon-rich amorphous metal silicide layer and the gate hard mask to form gate stacks; and thermally processing the silicon-rich amorphous metal silicide layer and the metal thin film to form a crystallized metal silicide layer.

The trenches for a recessed channel preferably have a depth of about 1,000 Å to 1,500 Å.

It is preferred that the gate conductive layer be formed of a polysilicon layer, the metal silicide layer be formed of a tungsten silicide layer, and the metal thin film be formed of a tungsten thin film.

It is preferred that the gate conductive layer have a thickness such that the upper surface of the gate conductive layer has as many grooves as possible taking into consideration the critical dimension and depth of the trenches for a recessed channel, i.e., the gate conductive layer has the maximum number of grooves can be accommodated by the critical dimensions and depth of the trenches for a recessed channel.

The gate conductive layer preferably has a thickness of 500 about Å to about 800 Å.

The silicon-rich amorphous metal silicide layer preferably has a thickness of about 1,000 Å to about 1,300 Å.

The step of filling the seams of the silicon-rich amorphous metal silicide layer with a metal thin film may include the sub-steps of: forming a metal thin film on the silicon-rich amorphous metal silicide layer so that the seams are filled; and planarizing the resulting structure to remove portions of the metal thin film formed on the surface of the silicon-rich amorphous metal silicide layer.

The metal thin film may have a thickness of 100 Å to 300 Å.

The thermal processing is preferably conducted by a rapid thermal process.

The rapid thermal process may be carried out in a nitrogen ($N_2$) atmosphere at about 700° C. to about 1,000° C.

BRIEF DESCRIPTION OF THE DRAWINGS

The features and advantages of the invention will be more clearly understood from the following detailed description taken in conjunction with the accompanying drawings, in which.

DESCRIPTION OF THE PREFERRED EMBODIMENTS

Preferred embodiments of the invention will now be described in detail with reference to the accompanying drawings. However, various variations and modifications can be made in the embodiments and the invention is not to be construed as limited to the following embodiments.

FIGS. 9 to 18 are cross-sectional views illustrating the method for fabricating a semiconductor device with a recessed channel according to the invention.

Figure 9:
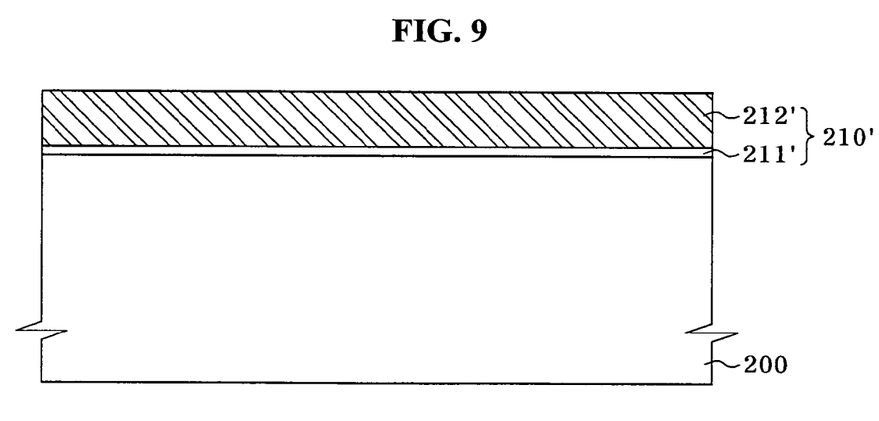
FIGS. 9 to 18 are cross-sectional views illustrating a method for fabricating a semiconductor device with a recessed channel according to the invention.

With reference first to FIG. 9, a pad oxide layer 211' and a pad nitride layer 212' are sequentially formed on a semiconductor substrate 200 to form a hard mask 210' for the formation of trenches for isolation. The pad oxide layer 211' is formed to have a thickness of about 50 Å to about 150 Å, and the pad nitride layer 212' is formed to have a thickness of about 500 Å to about 1,000 Å.

Figure 10:
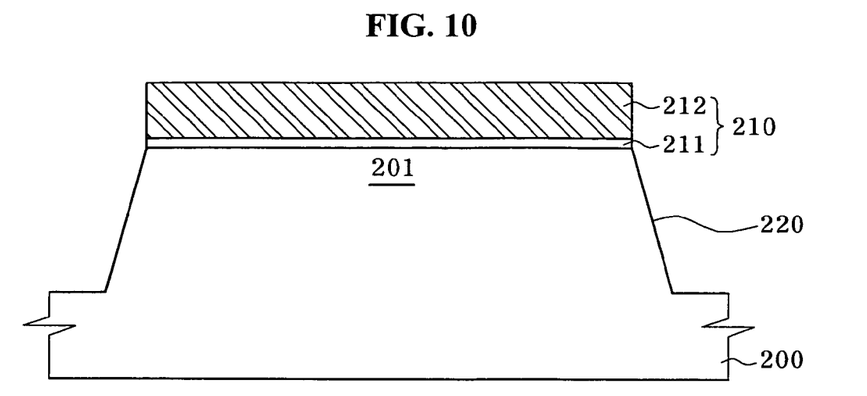

Referring to FIG. 10, portions of the surface of the semiconductor substrate 200, particularly isolation regions, are exposed by a common patterning process, leaving a hard mask pattern 210. The hard mask pattern 210 has a structure in which a pad oxide layer pattern 211 and a pad nitride layer pattern 212 are sequentially deposited. Subsequently, etching is conducted using the hard mask pattern 210 as a barrier layer to etch the exposed portions of the semiconductor substrate 200 to a predetermined depth to form trenches 220 for isolation defining an active area 201. The trenches 220 thus formed have a depth of about 2,000 Å to about 3,000 Å.

Figure 11:
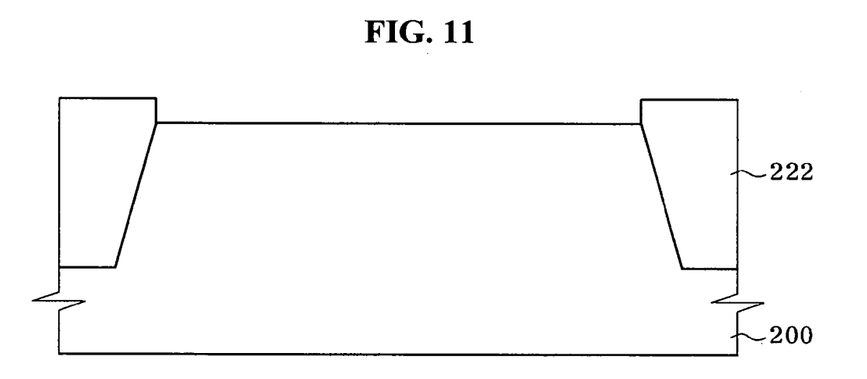

Referring to FIG. 11, a buried insulating layer is deposited on the entire surface of the resulting structure so that the inside of the trenches 220 is buried, followed by planarization, e.g., by chemical mechanical planarization (CMP), to form trench isolation layers 222. This planarization is conducted in such a manner that the surface of the hard mask pattern 210 is exposed. Before formation of the buried insulating layer, if necessary, a sidewall oxide layer, a liner nitride layer and a liner oxide layer may be formed in this order on each of the trenches 220. After formation of the trench isolation layers 222, the hard mask pattern 210 is removed.

Figure 12:
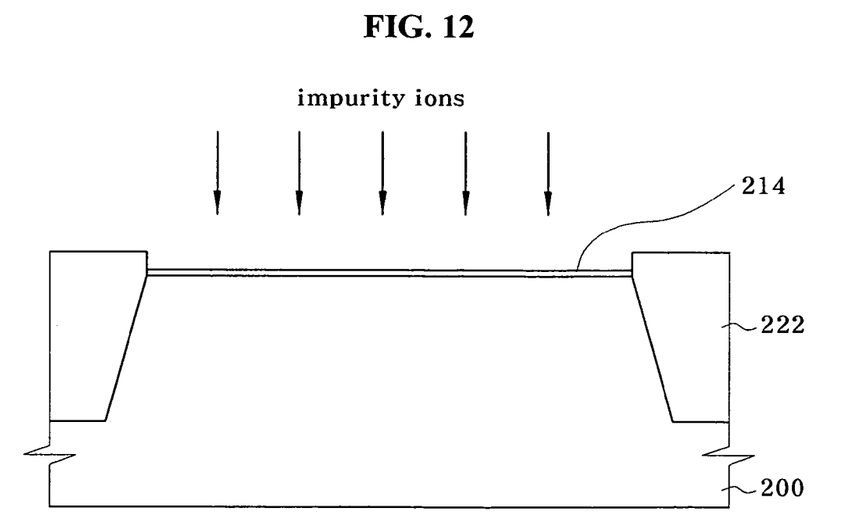

Referring to FIG. 12, a buffer oxide layer 214 for ion implantation is formed on the entire surface of the semiconductor substrate. As indicated by the arrows in the figure, an impurity ion implantation process for control of threshold voltage and an impurity ion implantation process for the formation of well/channel are carried out. Optionally, the impurity ion implantation processes may be performed in a subsequent step. After completion of the impurity ion implantation, the buffer oxide layer 214 is removed.

Figure 13:
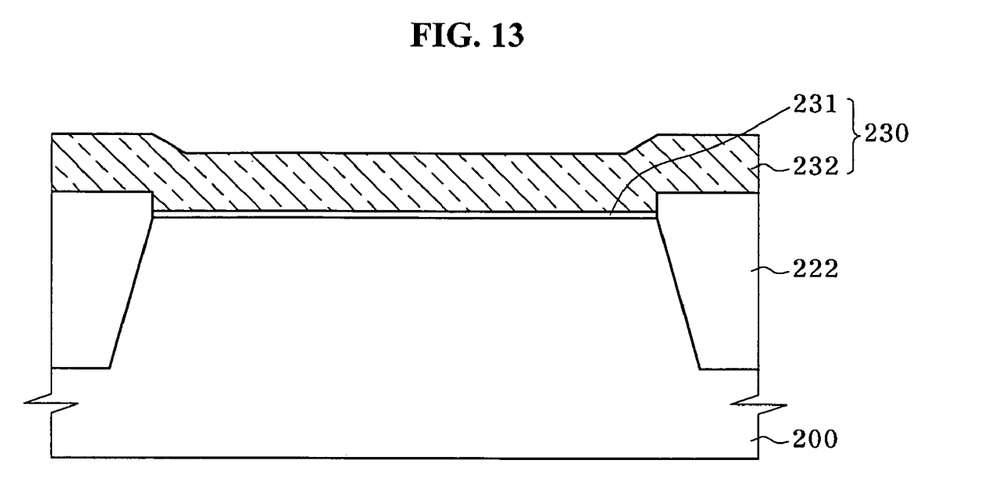

Referring to FIG. 13, a hard mask 230 consisting of an oxide layer 231 and a polysilicon layer 232 is formed on the semiconductor substrate 200. The hard mask 230 provides regions where trenches for a recessed channel are formed. If needed, other layers may be used instead of the polysilicon layer 232. The oxide layer 231 is formed to have a thickness of about 50 Å to about 100 Å, and the polysilicon layer 232 is formed to have a thickness of about 500 Å to 1,000 Å.

Figure 14:
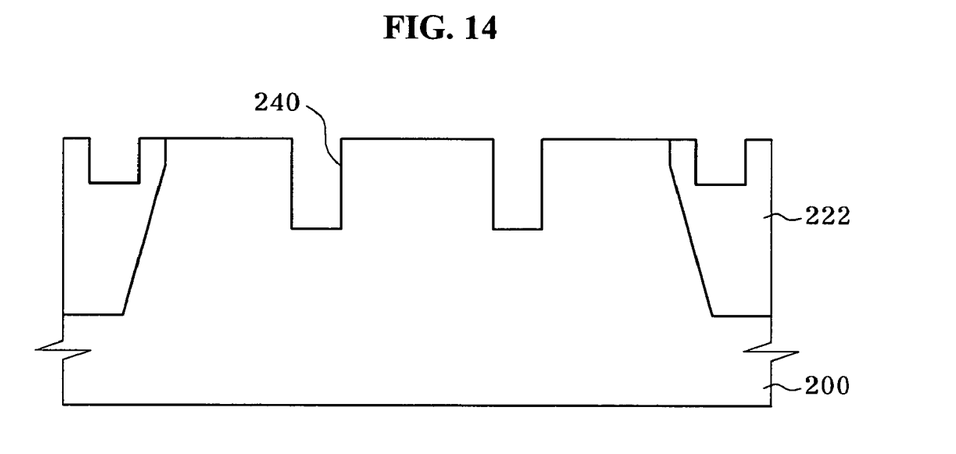

Referring to FIG. 14, a line-shaped photoresist pattern (not shown) is used to form a hard mask pattern (not shown), through which portions of the surface of the semiconductor substrate 200 are exposed to form trenches for a recessed channel. Subsequently, etching is conducted using the hard mask pattern as a barrier layer to etch portions of the semiconductor substrate 200 to a predetermined depth to form trenches 240 for a recessed channel. Then, the hard mask pattern is removed. The trenches 240 for a recessed channel are formed to have a depth of about 1,000 Å to about 1,500 Å.

Figure 15:
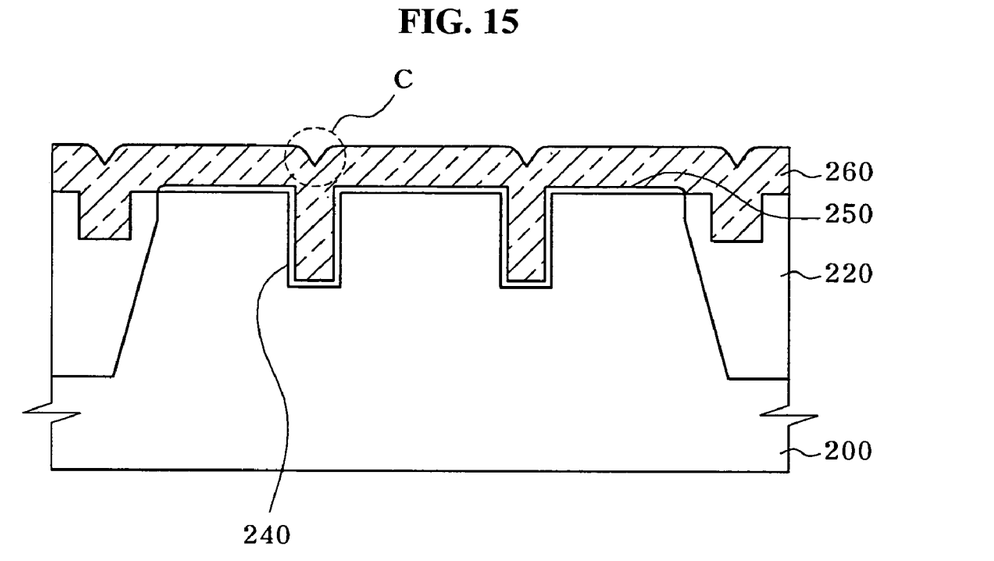

Referring to FIG. 15, a gate oxide layer 250 is formed on the surface of the semiconductor substrate 200 on which the trenches 240 for a recessed channel are formed. The gate oxide layer 250 is formed to have a thickness of about 30 Å to about 50 Å. Then, a polysilicon layer 260 defining a gate conductive layer doped with dopants is formed on the entire surface of the resulting structure so that the trenches 240 are buried. The upper topology of the polysilicon gate conductive layer 260 is grooved due to the presence of the trenches 240, as indicated by the sections "C" in the figure. At this time, the polysilicon gate conductive layer 260 is designed to have a thickness, preferably about 500 Å to 800 Å such that the upper surface of the polysilicon gate conductive layer has as many grooves as possible taking into consideration the critical dimension (CD) and depth of the trenches 240.

Figure 16:
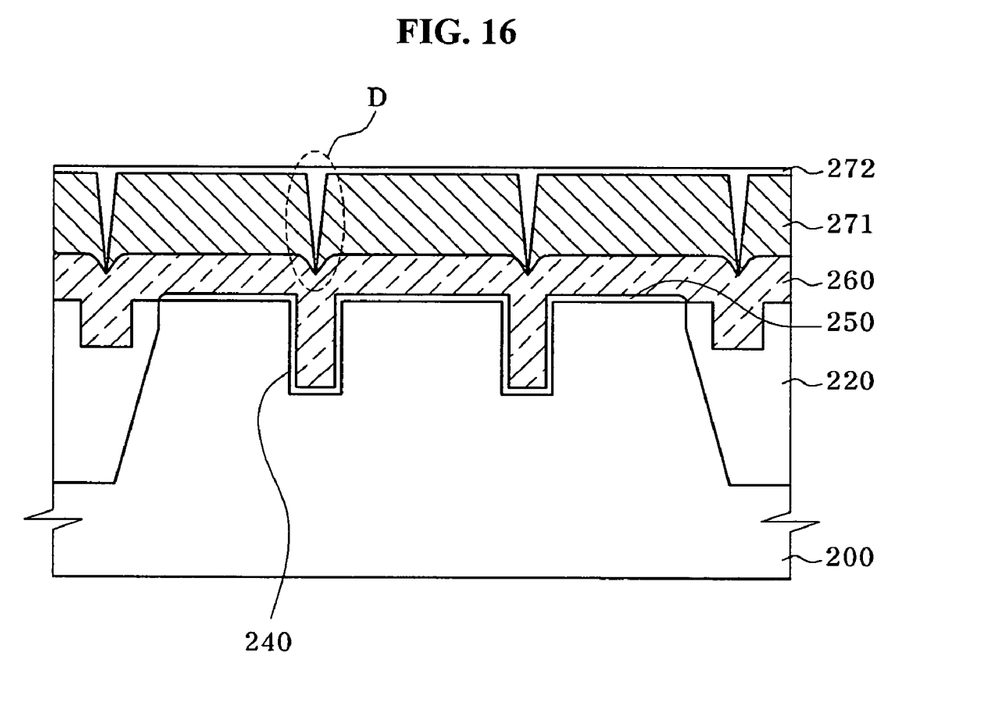

Referring to FIG. 16, a silicon-rich amorphous tungsten silicide layer 271 is formed on the polysilicon layer 260 by chemical vapor deposition (CVD). The silicon-rich amorphous tungsten silicide layer 271 is designed to have a thickness of about 1,000 Å to 1,300 Å. As explained with reference to FIG. 15, since as many grooves as possible are formed on the upper surface of the underlying polysilicon layer 260, as many seams as possible are formed on the tungsten silicide layer 271, as indicated by the sections "D" in the figure. A tungsten thin film 272 having a thickness about 100 Å to about 300 Å is deposited to fill the seams. The tungsten thin film 272 may be formed by chemical vapor deposition (CVD) or physical vapor deposition (PVD).

Figure 17:
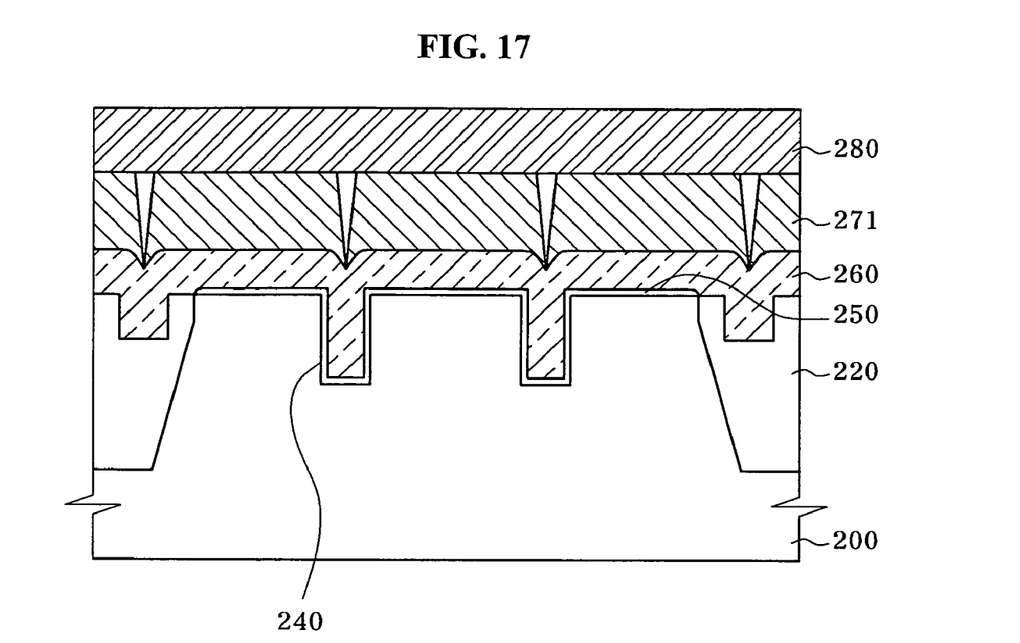

Referring to FIG. 17, the tungsten thin film 272 is planarized. This planarization of the tungsten thin film 272 can be performed by chemical mechanical planarization (CMP). The planarization is performed in such a manner that the surface of the underlying the tungsten silicide layer 271 is exposed. As a result of the planarization, only portions of the tungsten thin film 272 which fill the inside of the seams of the tungsten silicide layer 271 are left, and portions of the tungsten thin film formed on the tungsten silicide layer 271 are completely removed. Then, a gate hard mask 280, e.g., a nitride layer, is formed on the exposed portions of the tungsten silicide layer 271. The gate hard mask 280 is designed to have a thickness of about 2,000 Å to about 2,500 Å.

Figure 18:
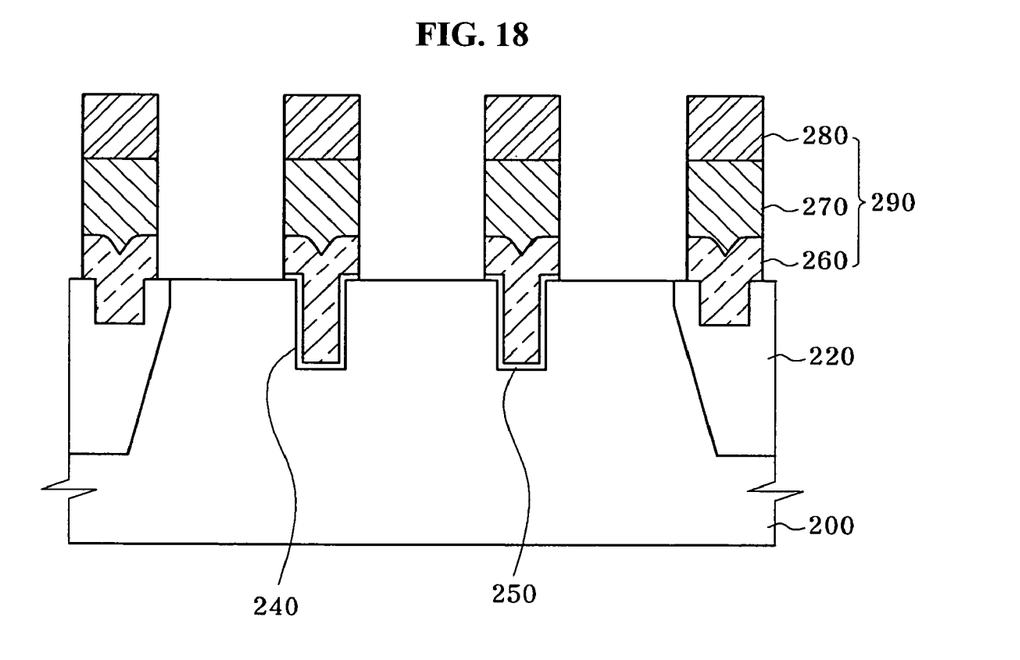

Referring to FIG. 18, a common patterning process is carried out to form gate stacks 290, followed by a rapid thermal process (RTP). As a result of the rapid thermal process, the silicon-rich amorphous tungsten silicide layer 271 thermally reacts with the tungsten thin film filled within the seams to form a crystallized tungsten silicide layer 270. The rapid thermal process is carried out in a nitrogen ($N_2$) atmosphere at about 700° C. to about 1,000° C.

As apparent from the above description, according to the method of the invention, a polysilicon layer is formed to a thickness such that the upper surface of the gate conductive layer has as many grooves as possible, a silicon-rich amorphous tungsten silicide layer is formed thereon, a tungsten thin film is filled within seams of the tungsten silicide layer, gate stacks are formed, followed by a rapid thermal process to form a crystallized tungsten silicide layer by a thermal reaction between the silicon-rich amorphous tungsten silicide layer and the tungsten thin film. Therefore, the method of the invention provides advantages in that an increase in the resistance of word lines is inhibited and the operating characteristics of the final semiconductor device are improved.

Although the invention has been described in detail with reference to preferred embodiments thereof, it will be understood by those skilled in the art that these embodiments do not serve to limit the invention and therefore various modifications are possible within the scope and spirit of the invention as recited in the accompanying claims.

What is claimed is:

1. A method for fabricating a semiconductor device with a recessed channel, the method comprising the steps of:
   forming trenches for a recessed channel in an active area of a semiconductor substrate;
   forming a gate insulating layer on the semiconductor substrate having the trenches;
   forming a gate conductive layer on the entire surface of the resulting structure so that the trenches are buried;
   forming a silicon-rich amorphous metal silicide layer having seams on the gate conductive layer;
   filling the seams of the silicon-rich amorphous metal silicide layer with a metal thin film;
   forming a gate hard mask on the silicon-rich amorphous metal silicide layer and the metal thin film;
   patterning the gate insulating layer, the gate conductive layer, the silicon-rich amorphous metal silicide layer and the gate hard mask to form gate stacks; and
   conducting the thermal treatment of the silicon-rich amorphous metal silicide layer and the metal thin film to form a crystallized metal silicide layer.

2. The method of claim 1, wherein the trenches for a recessed channel have a depth of about 1,000 Å to 1,500 Å.

3. The method of claim 1, comprising forming the gate conductive layer of a polysilicon layer, forming the metal silicide layer of a tungsten silicide layer, and forming the metal thin film of a tungsten thin film.

4. The method of claim 1, wherein the gate conductive layer has a thickness such that the upper surface of the gate conductive layer has a maximum number of grooves that can be accommodated by the critical dimension and depth of the trenches for a recessed channel.

5. The method of claim 1, wherein the silicon-rich amorphous metal silicide layer has a thickness of about 1,000 Å to 1,300 Å.

6. The method of claim 1, wherein the step of filling the seams of the silicon-rich amorphous metal silicide layer with a metal thin film includes the sub-steps of:
   forming a metal thin film on the silicon-rich amorphous metal silicide layer so that the seams are filled; and
   planarizing the resulting structure to remove portions of the metal thin film formed on the surface of the silicon-rich amorphous metal silicide layer.

7. The method of claim 1, comprising conducting the thermal treatment by a rapid thermal process.

8. The method of claim 4, wherein the gate conductive layer has a thickness of about 500 Å to 800 Å.

9. The method of claim 6, wherein the metal thin film has a thickness of about 100 Å to 300 Å.

10. The method of claim 7, comprising carrying out the rapid thermal process in a nitrogen ($N_2$) atmosphere at about 700° C. to about 1,000° C.

* * * * *